(12) United States Patent
Yamaguchi et al.

(10) Patent No.: US 11,915,939 B2
(45) Date of Patent: Feb. 27, 2024

(54) SEMICONDUCTOR FABRICATING METHOD

(71) Applicant: Hitachi High-Tech Corporation, Tokyo (JP)

(72) Inventors: Yoshihide Yamaguchi, Tokyo (JP); Sumiko Fujisaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/277,986

(22) PCT Filed: Sep. 1, 2020

(86) PCT No.: PCT/JP2020/032992
§ 371 (c)(1),
(2) Date: Mar. 19, 2021

(87) PCT Pub. No.: WO2021/192352
PCT Pub. Date: Sep. 30, 2021

(65) Prior Publication Data
US 2023/0005749 A1    Jan. 5, 2023

(30) Foreign Application Priority Data
Mar. 27, 2020 (WO) .................. PCT/JP2020/013952

(51) Int. Cl.
*H01L 21/3065* (2006.01)
*C23F 1/12* (2006.01)
*H01L 21/67* (2006.01)

(52) U.S. Cl.
CPC ............ *H01L 21/3065* (2013.01); *C23F 1/12* (2013.01); *H01L 21/67109* (2013.01)

(58) Field of Classification Search
None
See application file for complete search history.

(56) References Cited

U.S. PATENT DOCUMENTS

| 3,562,677 A | 2/1971 | Gunderson |
| 5,728,253 A | 3/1998 | Saito et al. |
| (Continued) | | |

FOREIGN PATENT DOCUMENTS

| CN | 102738039 A | 10/2012 |
| DE | 10-2006-009460 A1 | 9/2007 |
| (Continued) | | |

OTHER PUBLICATIONS

Search Report dated Nov. 2, 2020 in corresponding International Application No. PCT/JP2020/032992.
(Continued)

*Primary Examiner* — Stephanie P Duclair
(74) *Attorney, Agent, or Firm* — Miles & Stockbridge, P.C.

(57) ABSTRACT

A semiconductor fabricating method for a film to be processed containing a transition metal on an upper surface of a semiconductor wafer placed in a processing chamber in a container being etched with a gas for complexing the transition metal supplied into the processing chamber, including a first step of adsorbing, to the film, the complexing gas, while supplying the complexing gas, then increasing a temperature of the wafer to form an organic metal complex on a surface of the film, and volatilizing and desorbing the organic metal complex, and a second step of adsorbing, to the surface of the film, the complexing gas at a low temperature, while supplying the complexing gas, then stopping the supply of the complexing gas, and stepwise increasing the temperature of the wafer to volatilize and desorb an organic metal complex formed on the surface of the film.

10 Claims, 4 Drawing Sheets

(56) References Cited

U.S. PATENT DOCUMENTS

| | | |
|---|---|---|
| 7,582,491 B2 | 9/2009 | Sasaki et al. |
| 9,070,725 B2 | 6/2015 | Matsudo et al. |
| 9,239,265 B2 | 1/2016 | Taylor et al. |
| 2002/0048019 A1 | 4/2002 | Sui et al. |
| 2002/1089757 | 12/2002 | Denton et al. |
| 2004/0156026 A1 | 8/2004 | Kamiya |
| 2005/0106876 A1 | 5/2005 | Taylor et al. |
| 2008/0093315 A1 | 4/2008 | Okabe |
| 2008/0102001 A1 | 5/2008 | Chandrachood et al. |
| 2009/0204252 A1 | 8/2009 | Miyoshi et al. |
| 2015/0270148 A1 | 9/2015 | Shinoda et al. |
| 2018/0122665 A1 | 5/2018 | Kobayashi et al. |
| 2018/0197748 A1 | 7/2018 | Nishimura et al. |
| 2018/0308707 A1* | 10/2018 | Yamaguchi ....... H01L 21/31122 |
| 2019/0028725 A1 | 1/2019 | Zhang et al. |
| 2019/0348307 A1 | 11/2019 | Yamauchi et al. |
| 2020/0066541 A1 | 2/2020 | Yamauchi et al. |
| 2020/0328099 A1 | 10/2020 | Kobayashi et al. |

FOREIGN PATENT DOCUMENTS

| | | |
|---|---|---|
| EP | 1670041 A1 | 6/2006 |
| JP | 2003-519380 A | 6/2003 |
| JP | 2004-518727 A | 6/2004 |
| JP | 2007-234859 A | 9/2007 |
| JP | 2007-263583 A | 10/2007 |
| JP | 2008078618 A | 4/2008 |
| JP | 2015-185594 A | 10/2015 |
| JP | 2017059824 A | 3/2017 |
| JP | 2018-073962 A | 5/2018 |
| JP | 2018-092116 A | 6/2018 |
| JP | 2018-107202 A | 7/2018 |
| JP | 2018-113306 A | 7/2018 |
| JP | 2018110229 A | 7/2018 |
| JP | 2018110230 A | 7/2018 |
| JP | 2019054014 A | 4/2019 |
| JP | 2019-161157 A | 9/2019 |
| WO | 02054460 A1 | 7/2002 |
| WO | 2010008721 A | 1/2020 |

OTHER PUBLICATIONS

Jing Zhao et al. "Surface Chemistry of thermal dry etching of cobalt thin films using hexafluoroacetylacetone" Applied Surface Science 455, 2018, pp. 438-445.
Office Action dated Apr. 28, 2023 in Taiwanese Application No. 112105614.
Office Action dated Dec. 19, 2022 in U.S. Appl. No. 16/913,010.
Office Action dated Feb. 28, 2020 in U.S. Appl. No. 15/718,948.
Office Action dated Jul. 21, 2022 in U.S. Appl. No. 16/913,010.
Search Report dated May 31, 2022 in International Application No. PCT/JP2022/011898.
W. E. Hoke et al., J. Vac. Sci. Technol. B28, C3F5 (2010).
Written Opinion dated May 31, 2022 in International Application No. PCT/JP2022/011898.

* cited by examiner

SEMICONDUCTOR FABRICATING METHOD

TECHNICAL FIELD

The present invention relates to a semiconductor fabricating method that fabricates a semiconductor device by processing a film structure including a transition metal film or an oxide film of a transition metal disposed on a specimen in the form of a substrate such as a semiconductor wafer.

BACKGROUND ART

Demands made to a leading-edge semiconductor device for a size reduction, a higher speed/higher performance, and power saving have increasingly been accelerated and, in the semiconductor device, various new materials have been increasingly used. For example, according to a widely-accepted theory, electromigration of Cu (copper) wiring and a high resistivity of W (tungsten) wiring form barriers to further miniaturization of semiconductor wiring, and a transition metal such as Co (cobalt) or Ru (ruthenium) has also become a candidate for a next-generation wiring material. To use a conductor film containing such a transition metal element as the next-generation semiconductor micro wiring, ultra-high-precision processing on a nanometer level (film deposition and etching) is indispensable.

Patent Literature 1 discloses a dry etching method using an etching gas to which β-diketone and an oxidizing gas such as NO, $N_2O$, $O_2$, or $O_3$ are added for a deposited metal film formed of a metal element capable of forming a complex with β-diketone. To suppress fluctuations in etching speed, a technique disclosed in Patent Literature 1 proposes to set a content of water included in the etching gas to 30 mass ppm or less based on β-diketone. Patent Literature 2 discloses a dry etching method using an etching gas to which β-diketone, an oxidizing gas serving as a first additive gas, and $H_2O$ or $H_2O_2$ serving as a second additive gas are added. To achieve a higher etching speed, a technique disclosed in Patent Literature 2 proposes to appropriately adjust an amount of β-diketone and an amount of the second additive gas in the etching gas.

In Nonpatent Literature 1, it is proposed that, after a surface of a transition metal film (Co film) is transformed to an oxide film, a β-diketone gas such as hexafluoroacetylacetone is caused to act on the oxide film to thereby etch the transition metal film.

CITATION LIST

Patent Literatures

Patent Literature 1: Japanese Unexamined Patent Application Publication No. 2018-110230
Patent Literature 2: Japanese Unexamined Patent Application Publication No. 2018-110229

Nonpatent Literature

Nonpatent Literature 1: Jing Zhao, Mahsa Konh, Andrew Teplyakov "Surface Chemistry of thermal dry etching of cobalt thin films using hexafluoroacetylacetone" Applied Surface Science 455 (2018), pp. 438-445

SUMMARY OF INVENTION

Technical Problem

The existing techniques described above have not given sufficient consideration to a point as described below, and therefore a problem has occurred.

Specifically, with the technique disclosed in Patent Literature 1, fluctuations in etching speed when the etching processing is started and ended are suppressed, and the etching speed can be stabilized. Meanwhile, with the technique disclosed in Patent Literature 2, it is possible to increase the etching speed and achieve a high throughput. However, in each of Patent Literature 1 and Patent Literature 2, no consideration has been given to unevenness of a surface being etched which increases as the etching processing proceeds to result in increased roughness.

Such increased roughness of the surface being etched resulting from the etching processing is described in Nonpatent Literature 1. The present nonpatent literature describes a reaction mechanism while etching of a transition-metal-containing film proceeds in detail and clearly states that a main phenomenon while the etching proceeds is decomposition of β-diketone gas molecules at the surface of an etched material, and the etching is merely a secondary reaction. The present nonpatent literature also states that, due to a decomposition reaction of the β-diketone gas molecules, the etched surface after the etching processing is roughened.

Even when the etching speed is successfully increased or the fluctuations in etching speed are successfully suppressed by thus applying the technique of Patent Literature 1 or Patent Literature 2, since only insufficient consideration has been given to the roughened etched surface after the etching processing, a problem of a deteriorated yield of the processing has occurred.

An object of the present invention is to provide a semiconductor fabricating method with an improved yield.

Solution to Problem

The object described above is attained by a semiconductor fabricating method that etches a film to be processed containing a transition metal on an upper surface of a semiconductor wafer placed in a processing chamber in a container by supplying a gas for complexing the transition metal into the processing chamber, the semiconductor fabricating method comprising a first step including adsorbing the complexing gas to the film, then increasing a temperature of the wafer to form an organic metal complex on a surface of the film, and volatilizing and desorbing the organic metal complex, wherein each of the adsorbing the complex gas to the film, increasing the temperature of the wafer, and volatilizing and desorbing the organic metal complex of the first step is performed while supplying the complexing gas; and a second step including adsorbing the complexing gas to the surface of the film at a low temperature, while supplying the complexing gas, to form an organic metal complex, then stopping the supply of the complexing gas, and stepwise increasing the temperature of the wafer to volatilize and desorb the organic metal complex formed on the surface of the film.

Advantageous Effects of Invention

By implementing high-precision and high-speed etching while inhibiting a surface of a transition metal film from being roughened and inhibiting a magnitude of unevenness from being increased, a yield of etching processing is improved.

DESCRIPTION OF EMBODIMENTS

The present inventors have re-examined a reaction mechanism, while etching of a film containing a transition metal proceeds from various viewpoints, found that, when an organic metal complex is generated through a reaction between a film being etched and a β-diketone gas, there is a stability difference between an organic metal complex obtained in a case where the organic metal complex is generated at a high temperature and an organic metal complex obtained in a case where the organic metal complex is generated at a temperature in a low to intermediate temperature range, and arrived at the present invention. The organic metal complexes have different degradabilities depending on temperatures when the organic metal complexes were generated because the organic metal complex generated in a specified temperature region is grown in an oriented manner into the form of a compact film to have a stabilized film composition, and thus, in a specified temperature region, an organic metal complex forming reaction exhibits reaction saturation.

Meanwhile, under higher-temperature conditions, the organic metal complex forming reaction proceeds at a high speed, and accordingly organic metal complex molecules are irregularly stacked before being orientationally aligned. Therefore, it is assumed that a film formed at a high temperature has degraded stability compared to a film-like orientational organic metal complex layer generated in a lower to intermediate temperature range. In other words, while an outermost molecular layer of a film compactly formed in the low to intermediate temperature range has a function like that of a protective film, such a function of a film irregularly formed in a high temperature range is lower.

An embodiment of the present invention described below includes a configuration which is a semiconductor fabricating device or a semiconductor fabricating method in which a specimen such as a semiconductor wafer to be processed having a film containing a transition metal or the like is held on a stage in a processing chamber disposed in a container and evacuated by an exhaust device, and a complexing gas is supplied into the processing chamber to process the film on an upper surface of the wafer. During the processing, the configuration maintains a temperature of the wafer at a plurality of values, and also adjusts the supply of the complexing gas in association with the temperature.

The embodiment of the present invention also includes a configuration which is a semiconductor fabricating device or a semiconductor fabricating method in which a specimen on a substrate such as a semiconductor wafer having a film containing a transition metal is placed in a processing chamber in a vacuum container, and the film containing the transition metal on an upper surface of the specimen is processed to form a circuit structure. The configuration is capable of performing a processing step of supplying, after a gas and a foreign substance each adsorbed to a surface of the specimen are desorbed before the processing described above is started, a complexing gas into the processing chamber in a state where a temperature of the specimen described above is lower than a first temperature, increasing the temperature of the wafer to a second temperature, while supplying the complexing gas to cause a reaction between the film containing the transition metal and the complexing gas, stopping the supply of the complexing gas, sequentially and stepwise increasing the temperature of the specimen described above to a plurality of temperature values including third and fourth temperatures, and performing processing on the specimen, while maintaining the temperatures, and a processing step of continuously increasing, after the temperature of the wafer is increased to the second temperature, the temperature of the specimen to a predetermined temperature equal to or higher than the fourth temperature, while supplying the complexing gas, or capable of switchably performing these processing steps.

Referring to the drawings, the embodiment of the present invention will be described below.

Embodiment 1

Referring to FIGS. 1 to 4, an embodiment of the present invention will be described below. Note that, in the present description and the drawings, components having substantially the same functions are given the same reference numerals, and thus a repeated description thereof is omitted.

Figure 1:
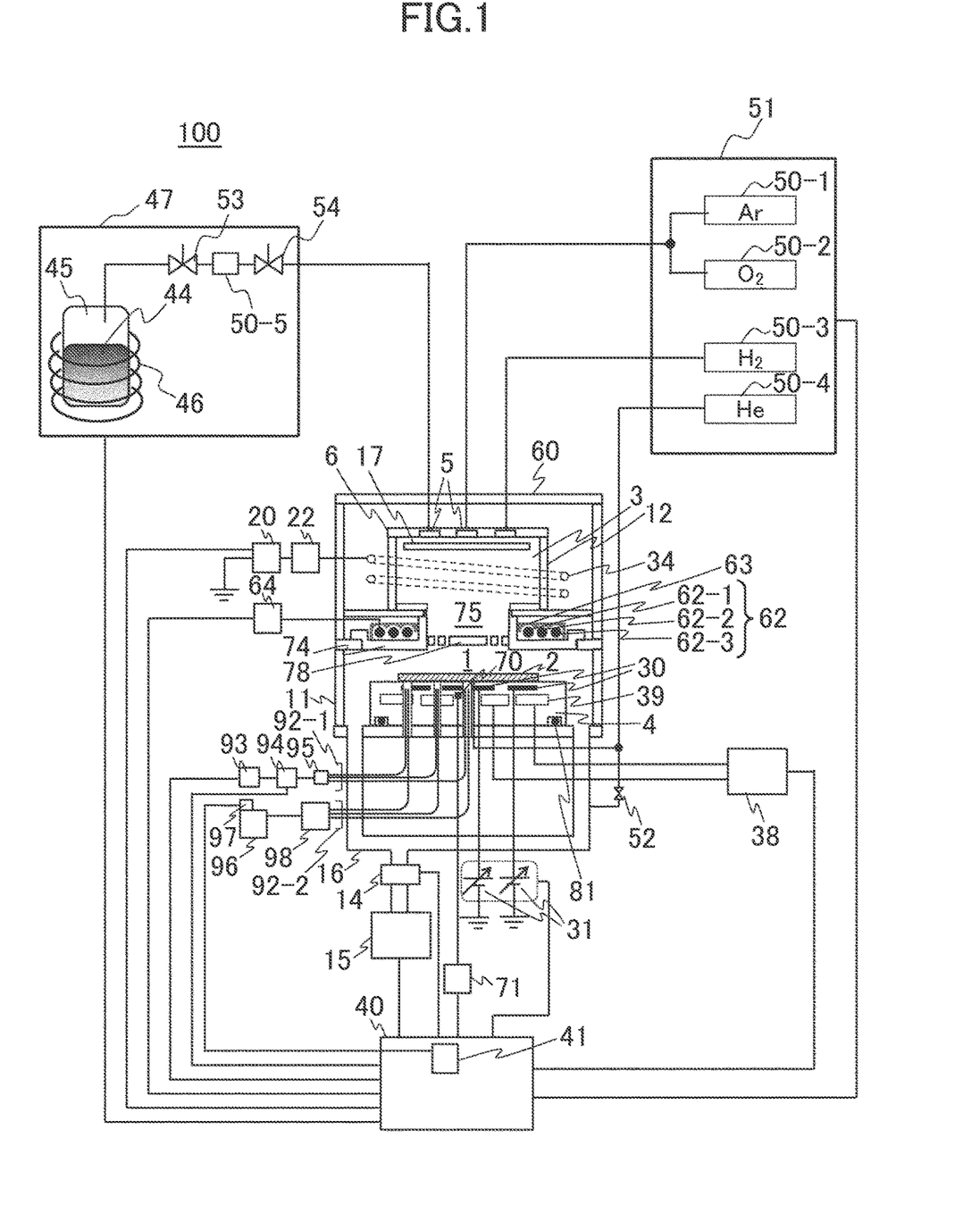
FIG. 1 is a vertical cross-sectional view schematically illustrating an outline of a configuration of a semiconductor fabricating device according to an embodiment of the present invention.

FIG. 1 is a vertical cross-sectional view schematically illustrating an outline of an overall configuration of a semiconductor fabricating device according to the embodiment of the present invention.

A processing chamber 1 is formed of a base chamber 11 which is a metallic container having a cylindrical shape. In the processing chamber 1, a wafer stage 4 (hereinafter referred to as the stage 4) on which a wafer (hereinafter referred to as the wafer, the semiconductor substrate, or the substrate) 2 serving as a specimen to be processed is to be placed is disposed. For a plasma source, an ICP (Inductively Coupled Plasma) discharge method is used. In an upper part of the processing chamber 1, the plasma source including a quartz chamber 12, an ICP coil 34, and an RF power source 20 is disposed. The ICP coil 34 is disposed herein outside the quartz chamber 12.

To the ICP coil 34, the RF power source 20 for plasma generation is connected via a matching box 22. As a frequency of an RF power, a frequency band in a frequency band of several tens of megahertz, such as 13.56 MHz, is assumed to be used. Over the quartz chamber 12, a top panel 6 is disposed. In the top panel 6, shower plates 5 are disposed, and a gas dispersion plate 17 is disposed thereunder. Gases (processing gases) to be supplied into the processing chamber 1 to process the wafer 2 are introduced into the processing chamber 11 from an outer periphery of the gas dispersion plate 17.

Flow rates of the processing gases to be supplied in the present embodiment are adjusted by mass flow controllers 50 disposed for individual gas species in a mass flow controller control unit 51. In FIG. 1, at least Ar, $O_2$, and $H_2$ are supplied as the processing gases into the processing chamber 1, and mass flow controllers 50-1, 50-2, and 50-3 are provided to correspond to the individual gas types. The gases to be supplied are not limited thereto. Note that, in the mass flow controller control unit 51, as will be described later, a mass flow controller 50-4 which adjusts a flow rate of a He gas to be supplied to a gap between a back surface of the wafer 2 and an upper surface of a dielectric film of the stage 4 on which the wafer 2 is to be placed is also included and disposed.

In the present embodiment, as at least one of the processing gases, a complexing gas generated from evaporation of a liquid raw material by using a complexing gas supplier 47 is used. In the complexing gas supplier 47, a tank 45 containing a liquid chemical 44 serving as the liquid raw material is present. The liquid chemical 44 is heated by a heater 46 covering the tank 45 from therearound, and an upper portion of the tank 45 is filled with vapor of the raw material. The liquid chemical 44 is the liquid raw material of the complexing gas serving as a component for transforming the film containing the transition metal formed in advance on a semiconductor substrate 2 to a volatile organic metal complex. The generated raw material vapor has a flow rate thereof controlled by the mass flow controller 50-5 and is introduced into the processing chamber 1 at a predetermined flow rate and a predetermined speed each appropriate for processing to become a gas at an intended concentration in the processing chamber 1. During a period during which the raw material vapor is not introduced into the processing chamber 1, valves 53 and 54 are closed to shut off the liquid raw material from the processing chamber 1. In addition, a pipe through which the raw material vapor is caused to flow is preferably heated such that the raw material vapor is not condensed in the pipe.

To allow the processing chamber 1 to be evacuated, a lower portion thereof is connected by a vacuum exhaust pipe 16 to an exhaust means 15. The exhaust means 15 is formed of, e.g., a turbo molecular pump, a mechanical booster pump, or a dry pump. In addition, to adjust respective flow rates of an inner gas and particles of a plasma 10 which are exhausted from inside the processing chamber 1 by an operation of the exhaust means 15 by increasing/reducing a flow path cross-sectional area corresponding to a cross-sectional area of the vacuum exhaust pipe 16 vertical to an axial direction thereof and thereby adjust respective pressures in the processing chamber 1 and a discharge region 3, a pressure adjusting means 14 including a plurality of plate-shaped flaps each disposed in a flow path to have an axis thereof in a traversing direction to rotate around the axis and a plate member moving in the flow path across an axial direction thereof is disposed on an upstream side of the exhaust means 15.

Between the stage 4 and the quartz chamber 12 forming an ICP plasma source, an IR (Infrared) lamp unit for heating the wafer 2 is disposed. The IR lamp unit includes an IR lamp 62 disposed in a ring shape above an upper surface of the stage 4, a reflection plate 63 disposed over the IR lamp 62 to cover the IR lamp 62 and reflect IR light, and an IR light transmission window 74. As the IR lamp 62 in the present embodiment, multiple circular lamps arranged in a concentric or helical configuration around a vertical center axis of the base chamber 11 or the stage 4 having a cylindrical shape are used. As light radiated from the IR lamp 62, light mainly including visible light and light in an infrared region is radiated. Such light is referred to herein as the IR light. In the configuration illustrated in FIG. 1, IR lamps 62-1, 62-2, and 62-3 corresponding to three laps are disposed as the IR lamp 62. However, IR lamps corresponding to two laps, four laps, or the like may also be disposed. Over the IR lamp 62, the reflection plate 63 for downwardly reflecting the IR light is disposed.

To the IR lamp 62, an IR lamp power source 64 is connected and, midway therebetween, an RF cut filter 25 for preventing noise of an RF power for generating a plasma, which is generated from the RF power source 20, from flowing into the IR lamp power source 64 is disposed. In addition, the IR lamp power source 64 is provided with such a function of being able to independently control powers to be supplied to the IR lamps 62-1, 62-2, and 62-3 and is configured to be able to adjust a radial distribution of an amount of heating of the wafer.

At a center of the IR lamp unit, a gas flow path 75 for allowing the gas supplied from the mass flow controller 50 into the quartz chamber 12 to flow toward the processing chamber 1 is formed. In the gas flow path 75, a slit plate (ion blocking plate) 78 in which a plurality of holes are opened is disposed to block ions and electrons generated in the plasma generated in the quartz chamber 12, transmit only a neutral gas and neutral radicals, and apply the neutral gas and the neutral radicals to the wafer 2.

The stage 4 has a refrigerant flow path 39 formed therein to cool the stage 4 such that a refrigerant is to be circulated and supplied by a chiller 38. In addition, to fix the wafer 2 to the stage 4 by electrostatic adsorption, electrostatic adsorption electrodes 30 each in the form of an electrode plate are embedded in the stage 4 and, to the individual electrostatic adsorption electrodes 30, respective DC (Direct Current) power sources 31 for electrostatic adsorption are connected.

Additionally, to efficiently cool the wafer 2, into a gap between a back surface of the wafer 2 placed on the stage 4 and the stage 4, an opening/closing valve is allowed to supply a He gas having a flow rate and a speed each appropriately adjusted by the mass flow controller 50-4 through a supply path disposed thereabove. The He gas passes through a path in the stage 4 communicatively connected to the supply path to be introduced into the gap between the back surface of the wafer 2 and an upper surface of the stage 4 on which the wafer 2 is to be placed from an opening disposed in the upper surface of the stage 4 and promote heat transfer between the wafer 2 and each of the stage 4 and the refrigerant flowing through the refrigerant flow path 39 in the stage 4.

Moreover, to prevent the back surface of the wafer 2 from being damaged even when heating and cooling is performed by activating the electrostatic adsorption electrodes 30 with the wafer 2 being electrostatically adsorbed, a wafer mounting surface of the stage 4 is coated with a resin such as polyimide. In addition, in the stage 4, a thermocouple 70 for measuring a temperature of the stage 4 is disposed, and the thermocouple 70 is connected to a thermocouple thermometer 71.

Furthermore, optical fibers 92-1 and 92-2 for measuring a temperature of the wafer 2 are disposed at three places in the vicinity of a center portion of the wafer 2 placed on the stage 4, in the vicinity of a radial middle of the wafer 2, and in the vicinity of an outer periphery of the wafer 2. The optical fiber 92-1 guides the IR light from an external IR light source 93 to the back surface of the wafer 2 to irradiate the back surface of the wafer 2 therewith. Meanwhile, the optical fiber 92-2 collects the IR light used by the optical fiber 92-1 for the irradiation and transmitted/reflected by the wafer 2 and transmits the collected IR light to a spectroscope 96.

The external IR light generated from the external IR light source 93 is transmitted to an optical path switch 94 for turning ON/OFF an optical path. Then, the optical path is branched by a light splitter 95 to a plurality of optical paths (three branches in the case of FIG. 1) to be applied to respective locations on the back surface side of the wafer 2 via the three-system optical fiber 92-1.

The IR light absorbed/reflected by the wafer 2 is transmitted by the optical fiber 92-2 to the spectroscope 96, and data on wavelength dependence of a spectral intensity is obtained using a detector 97. The obtained data on the wavelength dependence of the spectral intensity is transmitted to an arithmetic unit 41 of a control unit 40, and an absorption wavelength is calculated. Based on the absorption wavelength, the temperature of the wafer 2 can be determined. Midway in the optical fiber 92-2, an optical multiplexer 98 is disposed to allow light to be subjected to spectroscopic measurement to be switchably spectroscopically measured at any of measurement points at a center of the wafer, in a middle of the wafer, or on the outer periphery of the wafer. This allows the arithmetic unit to determine respective temperatures at the center of the wafer, in the middle of the wafer, and on the outer periphery of the wafer.

In FIG. 1, 60 denotes a container covering the quartz chamber 12, and 81 denotes an O-ring for hermetical sealing between the stage 4 and a bottom surface of the base chamber 11.

The control unit 40 controls turning ON/OFF of an RF power supply from the RF power source 20 to the ICP coil 34. The control unit 40 also controls the mass flow controller control unit 51 to adjust types of gases to be supplied from the respective mass flow controllers 50 into the quartz chamber 12 and flow rates thereof. In this state, the control unit 40 further activates the exhaust means 15 and controls the pressure adjusting means 14 to adjust a pressure in the processing chamber 1 to an intended value.

The control unit 40 further activates the DC power source 31 for electrostatic adsorption to cause the wafer 2 to be electrostatically adsorbed to the stage 4, and activates a mass flow controller 50-6 that supplies the He-gas into the gap between the wafer 2 and the stage 4. In this state, the control unit 40 controls the IR lamp power source 64 and the chiller 38 such that the temperature of the wafer 2 is in a predetermined temperature range, and the control is performed based on temperature distribution information of the wafer 2 obtained by the arithmetic unit 41 based on an inner temperature of the stage 4 measured by the thermocouple thermometer 71 and on the spectral intensity information in the vicinity of the center of the wafer 2, in the vicinity of a radial middle portion thereof, and in the vicinity of the outer periphery thereof each measured by the detector 97.

Figure 2:
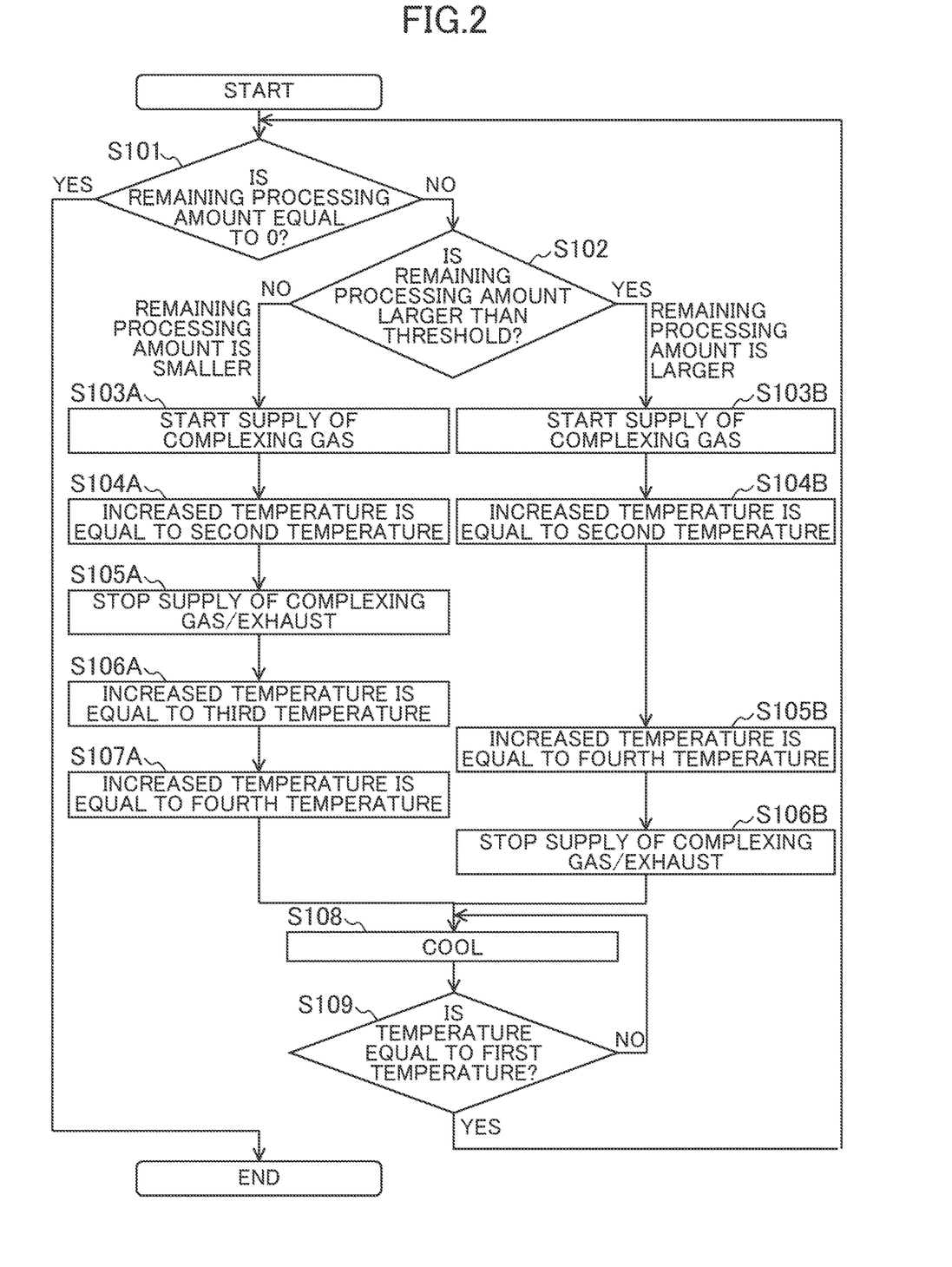
FIG. 2 is a flow chart illustrating a flow of an operation of etching processing by the semiconductor fabricating device according to the embodiment illustrated in FIG. 1.

Next, referred to FIGS. 2 to 4, a description will be given of a flow in which the semiconductor fabricating device in the present embodiment processes the wafer 2. FIG. 2 is a flow chart illustrating a flow of an operation of the semiconductor fabricating device according to the embodiment illustrated in FIG. 1, in which the semiconductor fabricating device processes a film layer placed in advance on the wafer to serve as an object to be processed. In particular, in the present embodiment, a description will be given of processing of etching a film containing a transition metal as the film layer to be processed. Note that such operations as introduction of processing gases into the processing chamber 1 and heating of the wafer 2 under irradiation with the IR light from the IR lamp 62, which are performed in individual process steps by a plasma processing device 100, are controlled by the control unit 40.

A description will be given below of each of the process steps.

The wafer 2 is held on a hand at a tip end of each of a plurality of arms included in a transfer robot disposed in an inner space of a vacuum conveying container as another vacuum container connected to a cylindrical side wall of the base chamber 11 which is not shown in FIG. 1 and conveyed in the inner conveyance space of the vacuum conveying container to be placed in a path extending between the inside and outside of the processing chamber 1 and through which the wafer 2 is internally carried in/out of the processing chamber 1. Then, the wafer 2 passes through a gate serving as an opening of the path to be introduced into the processing chamber 1. The wafer 2 supported above the upper surface of the stage 4 is delivered onto the stage 4.

The wafer 2 held on a film made of a dielectric material including aluminum oxide or yttrium oxide and forming a mounting surface for the wafer 2 delivered onto the stage 4 and placed on the upper surface thereof is adsorbed and fixed by a grip force of the upper surface of the film resulting from an electrostatic force generated by a DC power supplied to a film made of a metal such as tungsten and disposed in the film made of the dielectric material. In the upper surface of the wafer 2, a film structure including a plurality of upper and lower film layers including a film containing a transition metal and processed into a pattern shape forming a structure of a circuit of a semiconductor device is formed in advance, and a portion of a surface of a film to be processed is exposed.

The film containing the transition metal in the present embodiment is, for example, a lanthanum oxide ($La_2O_3$) film, a cobalt film, or the like, but the technique in the present embodiment is also applicable to a film made of a material of a type other than these. The film structure including the film to be processed is deposited using a known sputtering method, a known PVD (Physical Vapor Deposition) method, a known ALD (Atomic Layer Deposition) method, a known CVD (Chemical Vapor Deposition) method, or the like to have a film thickness which allows an intended circuit to be formed. The film structure may have also been processed using a photolithographic technique so as to have a shape in accordance with a pattern of the circuit.

Note that, in the case of a single metal element film such as a cobalt film, before the flow chart illustrated in FIG. 2 is performed, it is preferable to preliminarily change the metal to a compound such as an oxide or a chloride. For example, when the cobalt film is to be oxidized, first, an oxygen gas is supplied, while the wafer 2 is heated using an IR lamp in the plasma processing device 100 or a heating mechanism of the stage, or an oxygen plasma is generated to oxidize a surface of cobalt to provide a cobalt oxide layer.

In the plasma processing device 100 in the present embodiment, an exposed portion of a surface of a film layer to be processed is removed by selective etching. The plasma processing device 100 is characterized in that a dry etching technique not using a plasma as described below is applied thereto.

In a state where the wafer 2 is adsorbed and held on the upper surface of the stage 4, the He gas having a flow rate or a speed adjusted by the mass flow controller 50-4 is introduced from the opening in the upper surface of the stage 4 into the gap between the wafer 2 and the stage 4. This promotes the heat transfer between the wafer 2 and the stage 4 to adjust the temperature of the wafer 2. In this state, etching processing for processing the film layer to be processed containing the transition metal and disposed in advance on the surface of the wafer 2 is started to form the circuit structure of the semiconductor device.

First, Step S101 after the start is a step of determining a thickness of a remaining to-be-etched film thickness of the film to be processed containing the transition metal and formed in advance on the upper surface of the specimen (e.g., the wafer 2). In the present step, the remaining film thickness (hereinafter referred to as the remaining processing amount) of the film to be processed is determined by the control unit 40 by appropriately referencing values of design/specifications of the semiconductor device to be fabricated using the wafer 2 in each of cases where the etching processing is performed first on the film to be processed after the wafer 2 is carried in and where the etching processing has already been performed. The arithmetic unit 41 of the control unit 40 detects an amount of cumulative processing (cumulative processing amount) resulting from processing performed on the wafer 2 before the wafer 2 is carried in the processing chamber 1 and an amount of cumulative processing resulting from processing performed on the wafer 2 after the wafer 2 is carried in the processing chamber 1 and determines whether or not additional processing is necessary based on the values of the design/specifications of the wafer 2.

Specifically, when it is determined that the remaining processing amount is zero, the arithmetic unit 41 ends the processing of the film being processed and, when it is determined that the remaining processing amount is not zero, the arithmetic unit 41 controls to move the processing to Step S102. In Step S102, the remaining processing amount is compared to a predetermined threshold and determined to be larger or smaller (more or less) than the predetermined threshold. When the remaining processing amount is determined to be larger than the threshold, the arithmetic unit 41 controls to move the processing to Step S103B and, when the remaining processing amount is determined to be smaller than the threshold, the arithmetic unit 41 controls to move the processing to Step S103A.

The cumulative processing amount obtained as a result of performing the processing the flow of which is illustrated in FIG. 2 at least once on the wafer 2 transferred to the processing chamber 1 in the plasma processing device 100 according to the present embodiment can easily be determined from a cumulative number of times a continuous processing cycle including Steps S102 to Step S109 is performed and from a preliminarily acquired processing amount (processing rate) while the processing cycle is performed once. In the control unit 40, it may also be possible to determine the processing amount from a result of surface analysis performed on the wafer 2, a result obtained from an output from a remaining film thickness detector not shown, or a combination thereof.

When it is determined in Step S102 that the remaining processing amount is larger than the predetermined threshold, the arithmetic unit 41 controls to move the processing to Step S103B and performs subsequent steps (process B) preceding and including Step S105B. When it is determined in Step S102 that the remaining processing amount is smaller than the predetermined threshold, the arithmetic unit 41 controls to move the processing to Step S103A and performs subsequent steps (process A) preceding and including Step S107A. In these steps, the etching processing is performed on the film tor be processed, and the remaining film thickness is reduced.

Next, referring to FIG. 2 and FIG. 3 or FIG. 4, a flow of processing performed by the plasma processing device 100 according to the present embodiment on the wafer 2 will be described in conjunction with a flow of operations in the processes A and B. FIGS. 3 and 4 are time charts schematically illustrating the flow of the operations with respect to a temporal transition of the etching processing performed by the semiconductor fabricating device illustrated in FIG. 1 on the film to be processed on the wafer.

Figure 3:
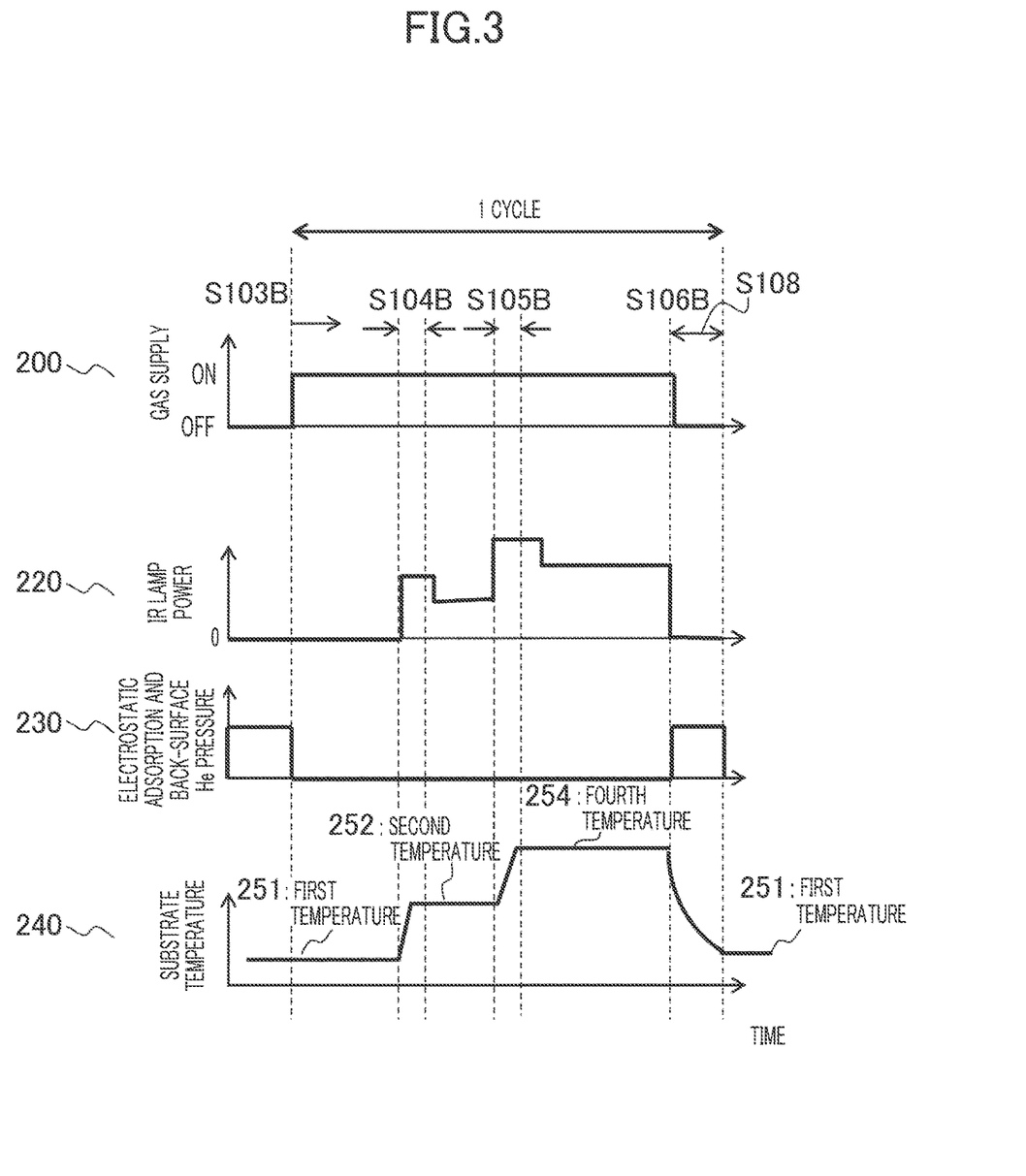
FIG. 3 is a time chart illustrating an example of the flow of the operation of the etching processing by the semiconductor fabricating device according to the embodiment illustrated in FIG. 1, which is along a flow of some of process steps in the flow chart illustrated in FIG. 2.
Figure 4:
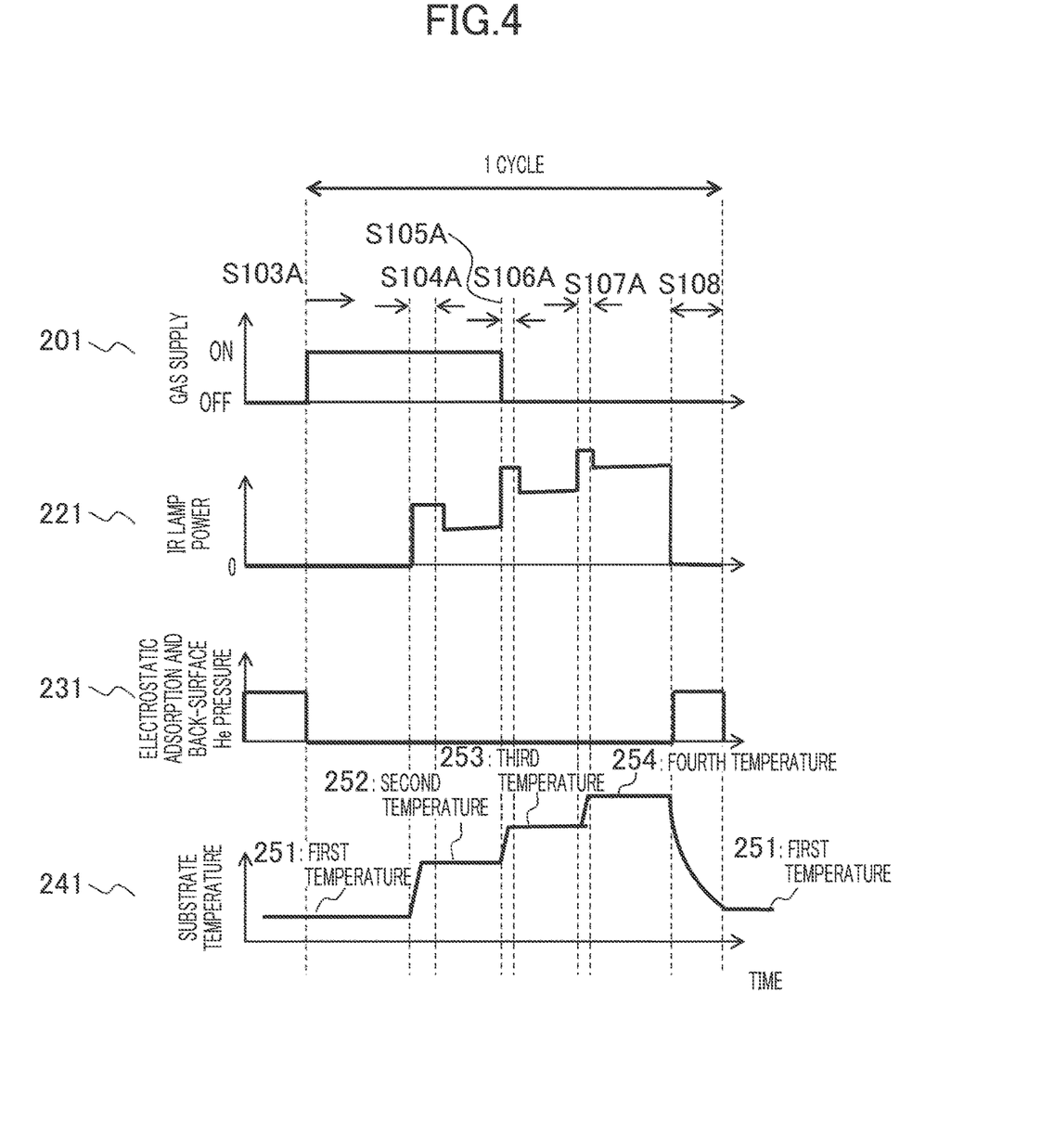
FIG. 4 is a time chart illustrating another example of the flow of the operation of the etching processing by the semiconductor fabricating device according to the embodiment illustrated in FIG. 1, which is along a flow of others of the process steps in the flow chart illustrated in FIG. 2.

In particular, each of FIGS. 3 and 4 illustrates the time chart when the film containing the transition metal element is etched using the plasma processing device 100. FIG. 3 illustrates a graph representing a time variation of a gas supply 200, a time variation of an IR lamp power 220, time variations of electrostatic adsorption and a back-surface He pressure 230, and a time variation of a substrate temperature 240 each corresponding to Steps S103B to S106B and S108 corresponding to the process B performed when "Remaining Processing Amount>Threshold" is satisfied in Step S102. Note that the substrate temperature 240 corresponds to the temperature of the wafer 2.

Meanwhile, FIG. 4 illustrates a graph representing a time variation of a gas supply 201, a time variation of an IR lamp power 221, time variations of electrostatic adsorption and a back-surface He pressure 231, and a time variation of a substrate temperature 241 each corresponding to Steps S103A to S107A and S108 corresponding to a typical example of the process A performed when "Remaining Processing Amount≤Threshold" is satisfied. The substrate temperature 241 corresponds to the temperature of the wafer 2.

Each of these drawings schematically illustrates the temperature of the wafer 2, gas supplying and exhausting operations during the etching processing in the present embodiment, and a temperature actually observed, a temperature gradient, and a required control time differ depending on a material to be etched, a type of a material to be complexed, a structure of the semiconductor device, and the like.

When a result of the determination in Step S102 is "Remaining Processing Amount>Threshold", the processing step in plasma processing device 100 controls to move to Step S103B to turn ON the gas supply 200 in FIG. 3 and, as a processing gas for transforming the film containing the transition metal on the upper surface of the wafer 2 placed in the processing chamber 1 to the organic metal complex having volatility, vapor of the liquid chemical 44 stored in the tank 45 has a flow rate or speed thereof adjusted by the mass flow controller 50-5 for supplying the complexing gas to a value within a range appropriate for the processing and is supplied. Such supply conditions (a supply amount, a supply pressure, and a supply period) for the complexing gas and the type of the complexing gas are determined in consideration of an element composition of the film containing the transition metal, a shape thereof, and a film thickness thereof, and the control unit 40 selects thereamong in accordance with an algorithm described in software stored in a storage device and transmits the selected supply conditions as an instruction signal.

Step S103B is a process step of forming physisorbed layers of particles of the complexing gas on the surface of the film containing the transition metal formed in advance on the upper surface of the wafer 2. This process step is performed by maintaining the temperature of the wafer 2 to a level in a temperature range equal to or lower than a boiling point of the complexing gas, as represented by a first temperature 251 as the substrate temperature 240 in FIG. 3. In the present embodiment, when it is determined that a minimum required number of the physisorbed layers to be etched, which are selected in consideration of an intended accuracy and an intended amount, are formed, the present process step need not be performed for a long period of time and is ended.

After a predetermined complexing gas supply is performed in Step S103B, the processing step in the plasma processing device 100 moves to Step S104B and, in a state where the supply of the complexing gas is continued, power is supplied from the IR lamp power source 64 to the IR lamp 62 to cause the IR lamp 62 to radiate the IR light and irradiate the wafer 2 with the IR light, as represented by the IR lamp power 220 in FIG. 3. As a result, as represented by the substrate temperature 240 in FIG. 3, the wafer 2 is heated to rapidly increase the temperature thereof to a second temperature 252. In this step, the wafer 2 is heated to increase the temperature thereof to the predetermined second temperature 252 higher than the first temperature 251. As a result, a reactivity of a surface material of the film containing the transition metal is activated to change a state of adsorption of the particles of the complexing gas adsorbed thereto from physical adsorption to chemical adsorption.

In Step S105B subsequent thereto, as represented by the gas supply 200 in FIG. 3, the supply of the complexing gas to the wafer 2 in the processing chamber 1 is maintained while, as represented by the IR lamp power 220 in FIG. 3, the heating of the wafer 2 by the IR lamp 62 is continued to increase the temperature of the wafer 2 to a fourth temperature 254 higher than the second temperature 252, as represented by the substrate temperature 240 in FIG. 3. In this step, a first phenomenon (1) in which the organic metal complex generated on the surface of the film containing the transition metal is volatilized to be desorbed and removed from the surface of the film and a second phenomenon (2) in which the continuously supplied complexing gas reacts with the surface of the film containing the transition metal to be transformed to the volatile organic metal complex proceed in parallel. When a specified small region of the surface of the film to be processed in this step is viewed microscopically, the phenomenon (1) of the removal of the complex from the surface of the film due to the volatilization (desorption) thereof and the phenomenon (2) of the transformation to and the formation of the new complex proceed intermittently or stepwise in order of (1), (2), (1), and (2). However, when the film surface is viewed as a whole, it can be considered that substantially continuous etching proceeds.

In Step S105B, while the supply of the complexing gas to the wafer 2 is continued for a predetermined period as represented by the gas supply 200 in FIG. 3, the wafer 2 is maintained at the fourth temperature 254 at which the organic metal complex formed in the previous step is volatilized and desorbed as represented by the substrate temperature 240 in FIG. 3, and the substantially continuous etching described above is continued. Then, the processing step in the plasma processing device 100 moves to Step S106B to turn OFF the gas supply 200 and stop the supply of the complexing gas. While the process steps in Steps S101 to S105B described above is performed, the exhaust means 15 including the exhaust pump are continuously driven to continue to exhaust the processing chamber 1 through the vacuum exhaust pipe 16 communicating with the processing chamber 1. By the exhaust continuously performed in the plurality of process steps including cooling of the wafer 2 which is performed after the supply of the complexing gas is stopped in Step S106B, the particles of the gas and the product in the processing chamber 1 are exhausted to the outside of the processing chamber 1, while the pressure therein is reduced.

Meanwhile, when the result of the determination in Step S102 is "Remaining Processing Amount≤Threshold", the processing step in the plasma processing device 100 moves to Step S103A to start the supply of the complexing gas for transforming the film containing the transition metal on the wafer 2 placed in the processing chamber 1 of the plasma processing device 100 to the volatile organic metal complex. In the control unit 40, the formation of the minimum required number of the physisorbed layers is detected in Step S103A, and then the processing step in the plasma processing device 100 moves to Step S104A to heat the wafer 2 under the radiation of the IR light from the IR lamp 62, as represented by the IR lamp power 221 in FIG. 4, to rapidly increase the temperature thereof to the second temperature 252, as represented by the substrate temperature 241 in FIG. 4.

In the same manner as in the process B, the supply conditions (the supply amount, the supply pressure, the supply period, and a temperature) for the complexing gas and the type of the complexing gas in the gas supply 201 in FIG. 4 are selected in consideration of the element composition of the film containing the transition metal, the shape thereof, the film thickness thereof, and the boiling point of the complexing gas and adjusted and set based on the instruction signal from the control unit 40. In this point, Step S104A is similar to Step S103B in the process B. In Step S104A, in the same manner as in Step S104B, the wafer 2 is heated to increase the temperature thereof to the second temperature 252 as represented by the substrate temperature 241 and maintain the temperature thereof at the second temperature 252. As a result, the reactivity of the surface of the film containing the transition meal is activated, and consequently a state of adsorption of the complexing gas is changed from the physical adsorption to the chemical adsorption.

By the processing in Step S104A or Step S104B, the complexing gas is brought into a state where the complexing gas is chemically adsorbed to the transition metal containing film. In this state, the molecules of the complexing gas are solidly fixed by chemical bonds between the molecules of the complexing gas and transition metal atoms contained in the transition metal containing film. In other words, it can be said that the complexing gas molecules are "pinned" to the surface of the transition metal containing film and, consequently, a speed at which the complexing gas molecules are diffused is low.

In Step S105A subsequent thereto, the plasma processing device 100 turns OFF the gas supply 201 in FIG. 4 to stop the supply of the complexing gas and internally exhaust the processing chamber 1. By internally exhausting the processing chamber 1, the plasma processing device 100 exhausts and removes, to the outside of the processing chamber 1, the entire complexing gas in a non-adsorbed state and in a physically adsorbed state except for the complexing gas left in a state chemically adsorbed to the surface of the transition metal containing film.

Next, in response to the instruction signal from the control unit 40, an amount of the IR light radiation from the IR lamp 62, which is continued from Step S104A, is increased, as represented by the IR lamp power 221 in FIG. 4, to increase the temperature of the wafer 2 to a third temperature 253 (Step S106A). The wafer 2 is maintained at the third temperature 253 only for a predetermined period. In this process step, the particles of the complexing gas chemically adsorbed to the surface of the film containing the transition metal are gradually transformed to the volatile organic metal complex through a reaction with the material of the surface of the film by the temperature increase to the third temperature 253 and the maintenance of the temperature for the predetermined period. In this step, as described above, there is no complexing gas but the complexing gas fixed by the chemical adsorption. Accordingly, a thickness of the generated organic metal complex layer is equal to or smaller than a thickness of the chemisorbed layer.

Additionally, in the present embodiment, the amount of the IR light radiation from the IR lamp 62, which is further continued as represented by the IR lamp power 221 in FIG. 4, is increased to heat the wafer 2 and increase the temperature thereof to the fourth temperature 254, and the temperature of the wafer 2 is maintained at the fourth temperature 254 for a predetermined period (Step S107A). In this step, a temperature at which the organic metal complex formed in the previous step is volatilized and desorbed is maintained, and the organic metal complex is removed from the surface of film to be processed.

The process A including the sequence of process steps in Steps S103A, S104A, S105A, S106A, and S107A is the same as the process B including the sequence of process steps in Steps S103B, S104B, S105B, and S106B in that the temperature of the wafer 2 is increased to the second temperature to generate the chemisorbed layer on the surface of the film containing the transition metal. However, in the process steps including and subsequent to the transformation of the chemisorbed layer to the organic metal complex, the process A and the process B have totally different operations or totally different operation flows.

Specifically, when the temperature of the organic metal complex or the film having the organic metal complex on the surface thereof increases to the fourth temperature 254 at which the organic metal complex is volatilized and removed in a state where the supply of the complexing gas is stopped by turning OFF the gas supply 201 as illustrated in FIG. 4, volatile removal of the organic metal complex in about one to several layers resulting from the transformation from the chemisorbed layer is ended, and the reaction ends at a time at which the film containing the transition metal located immediately therebelow is exposed in the processing chamber 1.

Meanwhile, when the temperature of the wafer 2 is increased to the fourth temperature 254 at which the organic metal complex is volatilized and removed while the supply of the complexing gas is continued by turning ON the gas supply 200 as illustrated in FIG. 3, the volatile removal of the organic metal complex in about one to several layers resulting from the transformation from the chemisorbed layer is ended. When the unreacted transition metal containing film located immediately therebelow is exposed, since the exposed transition metal containing film has been heated to the fourth temperature 254 and has an increased activation level, the exposed transition metal containing film is directly transformed to the organic metal complex through contact with the complexing gas. In addition, the generated organic metal complex is promptly volatilized and removed, and generally continuous etching of the film to be processed proceeds.

The process B including the sequence of process steps of Steps S103B, S104B, S105B, and S106B involves a reaction in which the film containing the transition metal is transformed directly to the organic metal complex and further volatilized and removed, and therefore exhibits a phenomenon in which a highly active minute region of the film containing the transition metal such as, e.g., a metal crystal grain boundary or a specified crystal orientation is preferentially transformed to the organic metal complex and removed. In addition, an organic metal complex layer generated without going through a plane orientation growth process which self-organizedly proceeds when the chemisorbed layer is generated has substantially no orientation, and also has a degraded heat resistant stability. As a result, the surface of the film containing the transition metal after being processed is not planarized and is increasingly roughened due to increased roughness.

In other words, in a sequential process including Steps S103A, S104A, S105A, S106A, and S107A, under the effect of self-organized orientation when the chemisorbed layer is formed, the surface of the film containing the transition metal after being processed is increasingly planarized.

Note that in either of the processes A and B, the fourth temperature 254 in the present embodiment is set, before the processing of the wafer 2, to be lower than each of a temperature at which the complexing gas molecules begin to decompose and a temperature at which molecules of the organic metal complex begin to decompose and higher than a temperature at which the organic metal complex molecules begin to volatilize. Alternatively, when a temperature difference between the temperature at which the organic metal complex molecules begin to decompose and the temperature at which the organic metal complex molecules begin to volatilize is small and insufficient in terms of specifications of the plasma processing device 100, e.g., a characteristic of temperature uniformity in a planar direction of the upper surface of the stage 4, an existing method for reducing the temperature at which the organic metal complex molecules begin to volatilize, e.g., a method of internally evacuating the processing chamber 1 to widen a mean free path may also be used appropriately.

Either of flows in the processes A and B moves next to Step S108 where the cooling of the wafer 2 is started, and the cooling of the wafer 2 in Step S108 is performed until, on receipt of outputs from the thermocouple 70 and the thermocouple thermometer 72, the control unit 40 detects that the temperature of the wafer 2 has reached the predetermined first temperature in Step S109.

After a predetermined amount of etching is reached, the plasma processing device 100 stops the supply of the complexing gas internally exhausts the processing chamber 100 (Step S106B), and cools the substrate (Step S108). In Step S108 for substrate cooling, it is desirable to supply a cooling gas to the gap between the wafer stage 4 and the semiconductor substrate 2 in a state where the electrostatic adsorption is ON, as represented by the electrostatic adsorption and the back-surface He pressure 230 in FIG. 3 or by the electrostatic adsorption and the back-surface He pressure 231 in FIG. 4. As the cooling gas, e.g., He, Ar, or the like is preferred. When a He gas is supplied, the substrate can be cooled in a short period of time, and accordingly processing productivity increases. Note that, in the wafer stage 4, the refrigerant flow path 39 which is a cooling circulation pipe connected to the chiller 38 is provided. Therefore, as long as being electrostatically adsorbed onto the wafer stage 4, the substrate 2 can be cooled even in a state where no cooling gas is allowed to flow.

In the stage 4, the thermocouple 70 for measuring the temperature of the stage 4 is disposed to be connected to the thermocouple thermometer 71 which is communicatively connected to the control unit 40. Also, in the present embodiment, to detect a distribution of the temperature of the wafer 2, temperature detectors using optical fibers are disposed at a plurality of places in an in-plane direction of the upper surface of the stage 4. As the plurality of places at which the temperature detectors are to be disposed, the vicinity of a center portion of the stage 4, the vicinity of an outer periphery thereof, and the vicinity of a middle point therebetween are preferred. When the control unit 40 having received outputs from the temperature detectors using the optical fibers detects that temperatures of portions of the stage 4 having these detectors have reached a predetermined temperature determined in advance, e.g., the first temperature, one cycle of the processing of etching the film to be processed on the wafer 2 is ended. Note that, instead of the outputs of the temperature detectors having the optical fibers, outputs of the thermocouple 70 and the thermocouple thermometer 71 may also be used.

When determining that the temperature of the wafer 2 has reached the first temperature 251, the control unit 40 returns to Step S101 and determines whether or not the remaining processing amount has reached zero. As described above, when it is determined by the control unit 40 that the remaining processing amount has reached zero, the plasma processing device 100 ends the processing of etching the film to be processed on the wafer 2. When it is determined that the remaining processing amount is larger than zero, the processing step in the plasma processing device 100 moves again to Step S102 to perform the processing in either the process A or the process B.

When the processing of the wafer 2 is to be ended, in response to the instruction signal from the control unit 40, the supply of the He gas supplied from the mass flow controller 50-4 into the gap between the upper surface of the stage 4 and the back surface of the wafer 2 from the opening of the upper surface through the supply path for the He gas is stopped. In addition, a valve 52 disposed on a discarded gas path communicating between the He gas supply path and the vacuum exhaust pipe 16 in a closed state is opened to exhaust the He gas from the gap to the outside of the processing chamber 1 and adjust a pressure in the gap to a level approximately equal to that of the pressure in the processing chamber, while a process step of eliminating the electrostatic adsorption of the wafer 2 including removal of static electricity is performed. Then, the gate of the base chamber 11 is opened, the wafer 2 is delivered to the tip end of any of the arms of the transfer robot that has entered the base chamber 11 from a vacuum conveying chamber. When there is the wafer 2 to be subsequently processed, the arm of the transfer robot holding the unprocessed wafer 2 enters the base chamber 11 again. When there is no wafer 2 to be processed, the gate is closed, and an operation of fabricating the semiconductor device performed by the plasma processing device 100 is stopped.

In the present embodiment, the second to fourth temperatures individually set in the processes A and B described above may have the same value or different values in the processes A and B. Moreover, the first to fourth temperatures 251 to 254 may be the same or different in the individual cycles. For these temperatures, appropriate temperature ranges are carefully examined and equally set in advance before the processing of the wafer 2. The control unit 40 reads information on the selected temperature ranges stored in a communicative storage device and sets, as conditions for processing the wafer 2 in the process A and the process B in the individual cycles, temperatures in the individual steps based on performance required of the plasma processing device 100 and on specifications of the wafer 2 to be processed.

Next, a description will be given of a semiconductor fabricating method implemented by the semiconductor fabricating device in the present embodiment.

In the present embodiment, at a stage before the etching processing for the wafer 2 is started, the wafer 2 is adsorbed onto the stage 4 to be held thereon, and then the processing chamber 1 is internally evacuated and the wafer 2 is heated. By heating the wafer 2 and increasing the temperature thereof, a gas (such as water vapor) and a foreign substance which are adsorbed to the surface of the wafer 2 are desorbed. When it is confirmed that a gas component adsorbed to the surface of the wafer 2 is sufficiently desorbed, the heating of the wafer 2 is stopped while the internally evacuated state is maintained in the processing chamber 1, and the cooling of the wafer 2 is started. For such heating/cooling, a known means can be used.

When the control unit 40 detects that the temperature of the wafer 2 lowers to reach a level equal to or lower than the predetermined first temperature 251, the processing of the wafer 2 is performed in accordance with the flow chart illustrated in FIG. 2. Note that, before the processing of the wafer 2 is started, e.g., before the wafer 2 is carried in the processing chamber 1, the control unit 40 detects processing conditions such as types and flow rates of gases and a pressure in the processing chamber 1 when the film to be processed on the wafer 2 is processed, i.e., a so-called processing recipe. For example, the control unit 40 acquires an ID number of each of the wafers 2 by using a mark engraved in the wafer 2 or the like and refers to data in a production management database through communication facilities such as a network connected to the control unit 40 and not shown to acquire data on a history of the processing of the wafer 2 corresponding to the number, a composition and a thickness of the film to be subjected to the etching processing, conditions such as an amount of etching to be performed on the film to be etched (a target remaining film thickness or a target depth over which the film is to be etched) and an etching end point, and the like.

For example, when detecting that the processing to be performed on the wafer 2 is etching processing of removing a lanthanum oxide film having an initial thickness of 0.3 nm smaller than a predetermined threshold, the control unit 40 determines that the processing to be performed on the wafer 2 is processing of removing lanthanum oxide corresponding to substantially one atomic or molecular layer based on respective ion radii of lanthanum (3+) and oxygen (2-) which are about 1.0 angstroms and about 1.3 angstroms. The control unit 40 then generates an instruction signal to each of the constituent units of the semiconductor fabricating device to cause the constituent unit to adjust an operation thereof in accordance with a flow (S103A, S104A, S105A, S106A, and S107A) of the process A to which the plasma processing device 100 moves after "Remaining Processing Amount≤Threshold" is determined in Step S102 in FIG. 2.

Meanwhile, when the control unit 40 determines that the processing to be performed on the wafer 2 is processing of removing a lanthanum oxide film having a film thickness exceeding a predetermined threshold of, e.g., 3 nm, it is required to remove about ten or more lanthanum oxide layers. When one of the layers mentioned above is to be etched at a time, the processing is repeated ten or more times, and consequently a processing period may increase n times to possibly degrade productivity. To prevent this, the plasma processing device 100 performs processing of collectively removing a plurality of layers (e.g., five to six layers) first and then removing one of the remaining film layers at a time. In the present embodiment, in such a case, the film to be processed is processed in accordance with a flow (S103B, S104B, S105B, and S106B) of the process B to which the plasma processing device 100 moves after "Remaining Processing Amount>Threshold" is determined in FIG. 2, and then performs processing in the flow (S103A, S104B, S105A, S106A, and S107A) of the process A at least once.

The processing in S103A or S103B corresponding to the first process step in the flow of the process A or the flow of the process B in the present embodiment illustrated in FIG. 2 is the processing of forming a physisorbed layer of the complexing gas on the surface of the film containing the transition metal, which is performed while the wafer 2 is maintained at a temperature equal to or lower than the boiling point of the complexing gas. For example, when acetylacetone (having a boiling point of about 140° C.) is used as the complexing gas, these process steps are performed at a temperature in a range up to about 120° C.

In the present embodiment, a preferred first temperature when acetylacetone is used as the complexing gas has a value within a range of 80° C. to 100° C. at a maximum, and preferably has a value not exceeding 80° C. when possible. When hexafluoroacetylacetone (having a boiling point of about 70° C.) is used as another example of the complexing gas, the preferred first temperature is 30° C. to 50° C.

After the physisorbed layer is thus formed in Step S103A or S103B, in Step S104A or S104B, the IR lamp power 220 in FIG. 3 or the IR lamp power 221 in FIG. 4 is turned ON to supply power from the IR lamp power source 64 to the IR lamp 62. Consequently, the IR light radiated from the IR lamp 62 heats the wafer 2 to rapidly increase the temperature thereof to the second temperature 252, as represented by the substrate temperature 240 in FIG. 3 or the substrate temperature 241 in FIG. 4, and change the state of adsorption of the complexing gas adsorbed to the surface of the film containing the transition metal from the physically adsorbed state to a chemically adsorbed state. The temperature increase in this process step gives activation energy for causing a change in the state of absorption of the particles of the complexing gas adsorbed to the surface of the film.

The second temperature 252 is determined in consideration of influences of both the surface state of the film containing the transition metal and a characteristic (reactivity) of a complexing material. When the complexing gas containing, as a main component, hexafluoroacetylacetone is supplied to a lanthanum oxide film as the film to be processed, a preferred range of the second temperature 252 is 80° C. to 160° C. When the second temperature 252 is lower than 80° C., a time required for the transformation to the chemisorbed layer is elongated. When the second temperature 252 exceeds 160° C., it is highly possible that the surface of the film brought into the chemically adsorbed state does not remain in the state, and is further transformed to the organic metal complex.

When the processing conditions included in the information acquired by the control unit 40 include a large amount of etching to be performed on the film to be subjected to the processing performed on the wafer 2, e.g., when the lanthanum oxide film corresponding to a thickness exceeding the threshold of 3 nm is to be removed by etching, infrared heating using the IR lamp 62 is further continued as represented by the IR lamp power 220 to increase the substrate temperature 240 to the fourth temperature 254, while the supply of the complexing gas such as hexafluoroacetylacetone is maintained in a state where the gas supply 200 is ON, as illustrated in FIG. 3 (Step S105B). The fourth temperature 254 is set to a level lower than a temperature at which thermal decomposition of the volatile organic metal complex generated through a reaction between the material of the surface of the film to be processed containing the transition metal and the complexing gas occurs and equal to or higher than a temperature at which sublimation or volatilization thereof begins. In the process B in the present embodiment, as illustrated in FIG. 3, at least during a period after the temperature of the wafer 2 is increased to the fourth temperature 254 in Step S105B until the gas supply 200 is turned OFF to stop the supply of the complexing gas in Step S106B, the temperature of the wafer 2 is maintained at a temperature equal to or higher than the fourth temperature 254. In accordance with such a flow, the surface of the film containing the transition metal on the upper surface of the wafer 2 is etched substantially continuously in the process B.

When the amount of etching to be performed is small, e.g., in the case of processing when the lanthanum oxide film corresponding to only a thickness of 0.3 nm is to be removed, the following sequence of process steps are performed. Specifically, in Steps 103A and 104A, processing is performed in the same manner as in Steps 103B and 104B described above, and then the gas supply 201 is turned OFF to stop the supply of the complexing gas such as hexafluoroacetylacetone, as illustrated in FIG. 4, to internally exhaust the processing chamber 1 and discharge particles affecting the processing therein (Step S105A). Then, the IR lamp power 221 is turned ON to heat the wafer 2 by using the IR lamp 62 to increase the temperature thereof to the third temperature 253 (Step S106A). Since the temperature of the film containing the transition metal is increased to the third temperature which is maintained for a predetermined period, the chemisorbed layer generated on the surface of the film is transformed to the organic metal complex.

The third temperature 253 in the present embodiment is set to a level in a range higher than the second temperature 252 and lower than the temperature at which the organic metal complex molecules begin to volatilize. In the case of etching processing using a lanthanum oxide film as the film containing the transition metal and using a gas mixture containing hexafluoroacetylacetone as a main component as the complexing gas, since the temperature at which the organic metal complex molecules begin to volatilize is about 200° C., it will be understood that the third temperature 253 preferably has a value between 160° C. and 190° C.

After the IR lamp power 231 is turned ON to continue the irradiation of the wafer 2 with the IR light from the IR lamp 62 and the wafer 2 is maintained at the third temperature 253 set in Step S106A for a predetermined period, the IR lamp power 231 is further increased in Step S107A to increase an intensity of the IR light from the IR lamp 62, with which the wafer 2 is irradiated, and increase the temperature of the wafer 2 to the fourth temperature 254. As a result of maintaining the temperature of the wafer 2 at the fourth temperature 254, the organic metal complex in about one to several layers resulting from the transformation of the chemisorbed layer is volatilized to be removed.

At a time at which the organic metal complex is removed and the film containing the transition metal and lying immediately therebelow or a layer made of a silicon compound or the like and located under the transition metal containing film is exposed, the reaction ends. Note that, in the case of processing using the lanthanum oxide film as the transition metal containing film and using the gas mixture containing hexafluoroacetylacetone as the main component as the complexing gas, a preferred fourth temperature 254 has a value within a range of 200° C. to 280° C. This is because, when the fourth temperature 254 is lower than 200° C., sublimation/volatilization does not begin while, when the fourth temperature 254 is over 280° C., it is highly possible that the organic metal complex decomposes.

Meanwhile, in the case of a cobalt film resulting from oxidation processing performed in advance on the wafer 2 in the plasma processing device 100, the oxidation processing and the flow illustrated in FIG. 2 are continuously performed. As a result, there is no need for the processing of desorbing a gas (such as water vapors) and a foreign substance performed by heating before the etching processing, which is illustrated in the flow.

In the flow illustrated in FIG. 2, the remaining processing amount represents a thickness of a cobalt oxide film on the surface of the cobalt film. When the control unit 40 detects that the processing to be performed on the wafer 2 is etching processing of removing the cobalt oxide film having an initial value of 0.3 nm smaller than a predetermined threshold, the control unit 40 generates an instruction signal to each of the constituent units of the semiconductor fabricating device to cause the constituent unit to adjust the operation thereof in accordance with the flow (S103A, S104A, S105A, S106A, and S107A) of the process A to which the plasma processing device 100 moves after "Remaining Processing Amount Threshold" is determined in Step S102 in FIG. 2.

Meanwhile, when the control unit 40 determines that the processing to be performed on the wafer 2 is the processing of removing the lanthanum oxide film having the film thickness exceeding the predetermined threshold of, e.g., 3 nm, it is required to remove about ten or more lanthanum oxide layers. When one of the layers mentioned above is to be etched at a time, the processing is repeated ten or more times, and consequently the processing period may increase n times to possibly degrade the productivity. To prevent this, the plasma processing device 100 performs the processing of collectively removing a plurality of layers (e.g., five to six layers) first and then removing one of the remaining film layers at a time. In the present embodiment, in such a case, the film to be processed is processed in accordance with the flow (S103B, S104B, S105B, and S106B) of the process B to which the plasma processing device 100 moves after "Remaining Processing Amount>Threshold" is determined in FIG. 2, and then performs processing in the flow (S103A, S104B, S105A, S106A, and S107A) of the process A at least once.

The processing in S103A or S103B corresponding to the first process step in the flow of the process A or the flow of the process B in the present embodiment illustrated in FIG. 2 is the processing of forming the physisorbed layer the complexing gas on the surface of the film containing the transition metal, which is performed while the wafer 2 is maintained at a temperature equal to or lower than the boiling point of the complexing gas. For example, when acetylacetone (having a boiling point of about 140° C.) is used as the complexing gas, these process steps are performed at a temperature in a range up to about 120° C.

In the present example, the preferred first temperature when acetylacetone is used as the complexing gas has a value within the range of 80° C. to 100° C. at a maximum, and preferably has a value not exceeding 80° C. when possible. When hexafluoroacetylacetone (having the boiling point of about 70° C.) is used as another example of the complexing gas, the preferred first temperature is 30° C. to 50° C.

After the physisorbed layer is thus formed in Step S103A or S103B, in Step S104A or S104B, power is supplied from the IR lamp power source 64 to the IR lamp 62. Consequently, the IR light radiated from the IR lamp 62 heats the wafer 2 to rapidly increase the temperature thereof to the second temperature and change the state of adsorption of the complexing gas adsorbed to the surface of the film containing the transition metal from the physically adsorbed state to the chemically adsorbed state. The temperature increase in this process step gives the activation energy for causing the change in the state of absorption of the particles of the complexing gas adsorbed to the surface of the film.

The second temperature is determined in consideration of the influences of both the surface state of the film containing the transition metal and the characteristic (reactivity) of the complexing material. When the complexing gas containing, as a main component, acetylacetone is supplied to a cobalt oxide film as the film to be processed, a preferred range of the second temperature is 80° C. to 190° C. When the second temperature is lower than 80° C., the time required for the transformation to the chemisorbed layer is elongated. When the second temperature exceeds 190° C., it is highly possible that the surface of the film brought into the chemically adsorbed state does not remain in the state, and is further transformed to the organic metal complex.

When the processing conditions included in the information acquired by the control unit 40 include a large amount of etching to be performed on the film to be subjected to the processing performed on the wafer 2, e.g., when the cobalt oxide film corresponding to a thickness exceeding the threshold of 3 nm is to be removed by etching, the infrared heating using the IR lamp 62 is further continued to increase the substrate temperature to the fourth temperature, while the supply of the complexing gas such as acetylacetone is maintained (Step S105B). The fourth temperature is set to a level lower than the temperature at which the thermal decomposition of the volatile organic metal complex generated through the reaction between the material of the surface of the film to be processed containing the transition metal and the complexing gas occurs and equal to or higher than the temperature at which sublimation or volatilization thereof begins. In the process B in the present embodiment, at least during the period after the temperature of the wafer 2 is increased to the fourth temperature in Step S105B until the supply of the complexing gas is stopped in Step S106B, the temperature of the wafer 2 is maintained at a temperature equal to or higher than the fourth temperature. In accordance with such a flow, the surface of the film containing the transition metal on the upper surface of the wafer 2 is etched substantially continuously in the process B.

When the amount of etching to be performed is small, e.g., in the case of processing when the cobalt oxide film corresponding to only a thickness of 0.3 nm is to be removed, the following sequence of process steps are performed. Specifically, the supply of the complexing gas such as acetylacetone is stopped to internally exhaust the processing chamber 1 and discharge particles affecting the processing therein (Step S105A). Then, the wafer 2 is heated using the IR lamp 62 to the third temperature (Step S106A). Since the temperature of the film containing the transition metal is increased to the third temperature which is maintained for a predetermined period, the chemisorbed layer generated on the surface of the film is transformed to the organic metal complex.

The third temperature in the present embodiment is set to a level in a range higher than the second temperature and lower than the temperature at which the organic metal complex molecules begin to volatilize. In the case of etching processing performed on the cobalt oxide layer on the surface of the cobalt film by using a gas containing acetylacetone as a main component as the complexing gas, since the temperature at which the organic metal complex molecules begin to volatilize is about 190° C., it will be understood that the third temperature preferably has a value between 160° C. and 190° C.

After the irradiation of the wafer 2 with the IR light from the IR lamp 62 is continued and the wafer 2 is maintained at the second temperature set in step S106A for a predetermined period, the intensity of the IR light from the IR lamp 62, with which the wafer 2 is irradiated, is further increased in Step S107A to increase the temperature of the wafer 2 to the fourth temperature. As a result of maintaining the temperature of the wafer 2 at the fourth temperature, the organic metal complex in about one to several layers resulting from the transformation of the chemisorbed layer is volatilized to be removed.

At a time at which the organic metal complex is removed and the film containing the transition metal and lying immediately therebelow or a layer made of a silicon compound or the like and located under the transition metal containing film is exposed, the reaction is ended. Note that, in the case of processing using the cobalt oxide film formed on the surface of the cobalt film as the transition metal containing film and using the gas mixture containing acetylacetone as the main component as the complexing gas, the preferred fourth temperature has a value within a range of 200° C. to 300° C. This is because, when the fourth temperature is lower than 200° C., sublimation/volatilization does not begin while, when the fourth temperature is over 300° C., it is highly possible that the organic metal complex decomposes.

Note that the complexing gas used in the present embodiment is an organic compound capable of forming at least bi- or higher-dentate coordination bonds with a transition metal atom, i.e., multidentate ligand molecules. Preferred examples thereof include diketones, ketoesters (each including two C=O bonds), and ketoimines (each including a C=O bond and a C=N bond). Specific examples thereof include acetylacetone, trifluoroacetylacetone, trifluorophenyl butadione, hexafluoroacetylacetone, dipivaloyl methane, thenoyltrifluoroacetone, trifluorofuryl butadione, dimethylheptafluoro octanedione, and the like.

As required, it may also be possible to use the complexing gas in which a complex stabilizing gas is mixed. The complex stabilizing gas is an organic compound having two or more elements each having an unshared electron pair in a molecular structure thereof, such as oxygen atoms, nitrogen atoms, or sulfur atoms, and preferably having five or more atoms other than hydrogen atoms and fluorine atoms, which is preferably ethers.

Ethers are appropriate as the complex stabilizing gas in terms of having no chemical reaction with the complexing gas shown above. Specific material names of some of such materials include a straight-chain ether such as dimethoxyethane, diethyleneglycol dimethylether, or propyleneglycol dimethylether, a cyclic ether such as tetrahydrofuran, 12-crown-4, or diaza-12-crown-4, adiponitrile, succinonitrile, and the like.

The study conducted by the present inventors has revealed that, when hexafluoroacetylacetone (liquid diketone compound) serving as the complexing gas and diethyleneglycol dimethylether (liquid straight-chain ether compound) serving as the complex stabilizing gas are used as the processing gas, a reaction between the processing gas and each of a metal such as a silicon dioxide film ($SiO_2$), silicon (Si), stainless steel (SUS), copper (Cu), or tungsten (W), a nitride film such as a titanium nitride film (TiN) or a silicon nitride film (SiN), and a metal fluoride such as yttrium fluoride ($YF_3$) does not occur or occurs only in a sufficiently smaller amount, while the processing gas exhibits a high reactivity with a metal oxide (metal oxide containing a rare earth element) containing a group 3A metal such as lanthanum (La) or yttrium (Y).

As described above, in the plasma processing device 100 according to the present embodiment, the film to be processed containing the transition metal and formed in advance on the wafer 2 can be processed with high accuracy and with a high throughput.

In particular, by performing processing based on an amount of processing determined in advance while switching between a processing cycle including a step of stopping a supply of a processing gas depending on a required step, sequentially and stepwise increasing a temperature of the target film being processed up to a predetermined value, and etching the film to be processed on the wafer 2, while preventing an increase in roughness of the surface thereof and a processing cycle including a step of increasing the temperature of the film to a high level, while supplying the processing gas, and performing substantially continuous etching, the film is processed at a high etching speed. Meanwhile, a deviation of a post-processing shape from an intended shape is prevented. By such a semiconductor fabricating device or a semiconductor fabricating method, a high processing yield is achieved.

INDUSTRIAL APPLICABILITY

The present invention can be used in process steps of forming a pattern on a semiconductor substrate in a field of semiconductor device fabrication.

LIST OF REFERENCE SIGNS

1 Processing Chamber
2 Wafer
3 Discharge Region
4 Stage
5 Shower Plate
6 Top Panel
10 Plasma
11 Base Chamber
12 Quartz Chamber
14 Pressure Adjusting Means
15 Exhaust Means
16 Vacuum Exhaust Pipe
17 Gas Dispersion Plate
20 RF Power Source
22 Matching Box
25 RF Cut Filter
30 Electrostatic Adsorption Electrode
31 DC Power Source
34 ICP Coil
38 Chiller
39 Refrigerant Flow Path
40 Control Unit
41 Arithmetic Unit
44 Liquid Chemical
45 Tank
46 Heater
47 Complexing Gas Supplier
50 Mass Flow Controller
51 Mass Flow Controller Control Unit
52, 53, 54 Valves
60 Container
62 IR Lamp
63 Reflection Plate
64 IR Lamp Power Source
70 Thermocouple
71 Thermocouple Thermometer
74 IR Light Transmission Window
75 Gas Flow Path
78 Slit Plate 81 O-Ring
92 Optical Fiber
93 External IR Light Source
94 Optical Path Switch
95 Light Splitter
96 Spectroscope
97 Detector
98 Optical Multiplexer
100 Plasma Processing Device

The invention claimed is:

1. A semiconductor fabricating method that etches a film to be processed containing a transition metal on an upper surface of a semiconductor wafer placed in a processing chamber in a container by supplying a complexing gas for complexing the transition metal into the processing chamber, the semiconductor fabricating method comprising:
 a first step including adsorbing the complexing gas to the film, then increasing a temperature of the wafer to form an organic metal complex on a surface of the film, and volatilizing and desorbing the organic metal complex, wherein an entirety of each of the adsorbing the complexing gas to the film, increasing the temperature of the wafer, and volatilizing and desorbing the organic metal complex of the first step is performed while supplying the complexing gas; and
 a second step including adsorbing the complexing gas to the surface of the film at a low temperature, while supplying the complexing gas, to form an organic metal complex, then stopping the supply of the complexing gas, and stepwise increasing the temperature of the wafer to volatilize and desorb the organic metal complex formed on the surface of the film.

2. The semiconductor fabricating method according to claim 1, wherein the first step is repeated once or a plurality of times, and then the second step is repeated once or a plurality of times.

3. The semiconductor fabricating method according to claim 1, wherein the first step includes heating the wafer in a state where the complexing gas is supplied to increase the temperature of the wafer to a level lower than a temperature for desorbing the organic metal complex, maintaining the lower temperature for a predetermine period to chemically adsorb particles of the complexing gas physically adsorbed to the film, and then heating the wafer to the higher temperature to desorb the organic metal complex.

4. The semiconductor fabricating method according to claim 1, wherein the second step includes heating the wafer to the lower temperature, while supplying the complexing gas, maintaining the lower temperature for a predetermined period to chemically adsorb the particles of the complexing gas physically adsorbed to the film, and then stopping the supply of the complexing gas.

5. The semiconductor fabricating method according to claim 3, wherein the second step includes heating the wafer to the lower temperature, while supplying the complexing gas, maintaining the lower temperature for a predetermined period to adsorb the particles of the complexing gas to the film, and then stopping the supply of the complexing gas.

6. The semiconductor fabricating method according to claim 1, wherein the second step includes stopping the supply of the complexing gas, increasing the temperature of the wafer to form the organic metal complex on the surface of the film, and then further increasing the temperature of the wafer to volatilize and desorb the organic metal complex.

7. The semiconductor fabricating method according to claim 1, wherein the first step and the second step include volatilizing and desorbing the organic metal complex formed on the surface of the film at a temperature higher than a temperature at which the molecules of the organic metal complex begin to volatilize and lower than a temperature at which the molecules of the organic metal complex begin to decompose.

8. The semiconductor fabricating method according to claim 1, wherein at least either of the first step and the second step includes setting the wafer at a temperature equal to or lower than a boiling point of the complexing gas, while supplying the complexing gas, to adsorb the complexing gas to the film.

9. The semiconductor fabricating method according to claim 1 wherein, before the first step or the second step is initiated, the wafer placed in the processing chamber is heated such that water vapor is desorbed therefrom, and then the wafer is cooled.

10. The semiconductor fabricating method according to claim 1, wherein the first step or the second step includes supplying a complex stabilizing gas together with the complexing gas.

* * * * *